(12) United States Patent
Pickering et al.

(10) Patent No.: US 8,766,693 B2
(45) Date of Patent: Jul. 1, 2014

(54) PHASE INTERPOLATOR WITH INDEPENDENT QUADRANT ROTATION

(71) Applicant: Texas Instruments Incorporated, Dallas, TX (US)

(72) Inventors: Andrew Pickering, Warwickshire (GB); Andrew Stewart, Northamptonshire (GB); Benjamin James Kerr, Northamptonshire (GB)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/755,751

(22) Filed: Jan. 31, 2013

(65) Prior Publication Data

US 2013/0200936 A1 Aug. 8, 2013

(30) Foreign Application Priority Data

Jan. 31, 2012 (GB) .................................. 1201610.1

(51) Int. Cl.
*H03K 3/00* (2006.01)
*H04L 7/00* (2006.01)

(52) U.S. Cl.
CPC .................................. *H04L 7/0025* (2013.01)
USPC ............................ 327/238; 327/254; 327/237

(58) Field of Classification Search
CPC .................... H03K 2005/00208; H04L 7/0025
USPC ......... 327/231, 234, 237, 238, 246, 247, 254, 327/355, 403, 404, 407, 408, 409
See application file for complete search history.

(56) References Cited

U.S. PATENT DOCUMENTS 7,298,194 B2 * 11/2007 Pickering et al. ............. 327/231

* cited by examiner

*Primary Examiner* — Lincoln Donovan
*Assistant Examiner* — Jung H Kim
(74) *Attorney, Agent, or Firm* — John R. Pessetto; Wade J. Brady, III; Frederick J. Telecky, Jr.

(57) ABSTRACT

The present invention provides an improvement of a 4-quadrant clock phase interpolator design to allow independent rotation of the output clocks in steps of 90°. This feature is useful in clock/data recovery where the 90° "jumps" can be used as a coarse control to re-align the data capture clock to achieve any desired data word alignment and/or receive bus clock alignment. The phase interpolator has a switching circuit comprising a single level of switches; a set of four transistor loads; and a set of four current sources operable to be switched by the switching circuit through to any of the set of four transistor loads.

1 Claim, 4 Drawing Sheets

PHASE INTERPOLATOR WITH INDEPENDENT QUADRANT ROTATION

FIELD OF THE INVENTION

This application claims priority under 35 USC §119(e)(1) of European Application Number GB 1201610.1, filed on Jan. 31, 2012.

The present invention relates to phase interpolators, and more particularly to an phase interpolator with independent quadrant rotation.

BACKGROUND OF THE INVENTION

The generic structure of a 4-quadrant phase interpolator as disclosed in the Applicant's prior patent no. GB2415101, is shown in FIG. 1, and consists of a set of 4 differential amplifiers driven by quadrature clocks Clk0 & Clk1 and their complements Clk2 & Clk3 (i.e. 4 quadrature phases in total). The four differential amplifiers effectively operate at 90° intervals and each is connected to a current source device whose bias voltage is controlled in order to adjust the phase of the outgoing clock to the desired alignment.

There is now a need for an improvement of the prior art 4-quadrant clock phase interpolator design to allow independent rotation of the output clocks in steps of 90°.

SUMMARY OF THE INVENTION

The present invention provides an improvement of a prior art 4-quadrant clock phase interpolator design to allow independent rotation of the output clocks in steps of 90°. This feature is potentially useful in clock/data recovery where the 90° "jumps" can be used as a coarse control to re-align the data capture clock to achieve any desired data word alignment and/or receive bus clock alignment.

One such example for instance is in a 8b10b encoded data stream where shifting the data capture clock to a specific bit of the data word provides a minimum latency mechanism for achieving comma alignment which attains a defined alignment of data words within the serial bit stream.

According to a first aspect of the invention, there is provided a phase interpolator with independent quadrant rotation, comprising: a switching circuit comprising a single level of switches; a set of four transistor loads; and a set of four current sources operable to be switched by the switching circuit through to any of the set of four transistor loads.

Examples of the invention will now be described with reference to the accompanying drawings of which:

DESCRIPTION OF SPECIFIC EMBODIMENTS OF THE INVENTION

As described above, the phase of the output signal is controlled by the 4 bias voltages applied to each of the 4 differential pairs in the phase interpolator bridge. One such apparatus for achieving this was described in the Applicant's prior patent no. GB 2415100 and consists of an array of differentially switched current sources controlled using a thermometer code (PS<30:0> and complement PSZ<30:0>) to adjust the phase within a quadrant in conjunction with a 2-bit quadrant select code (QS<1:0> and complement QSZ<1:0>) to select the currently active quadrant. One possible embodiment of this bias generator is illustrated in FIG. 2.

Figure 2A:
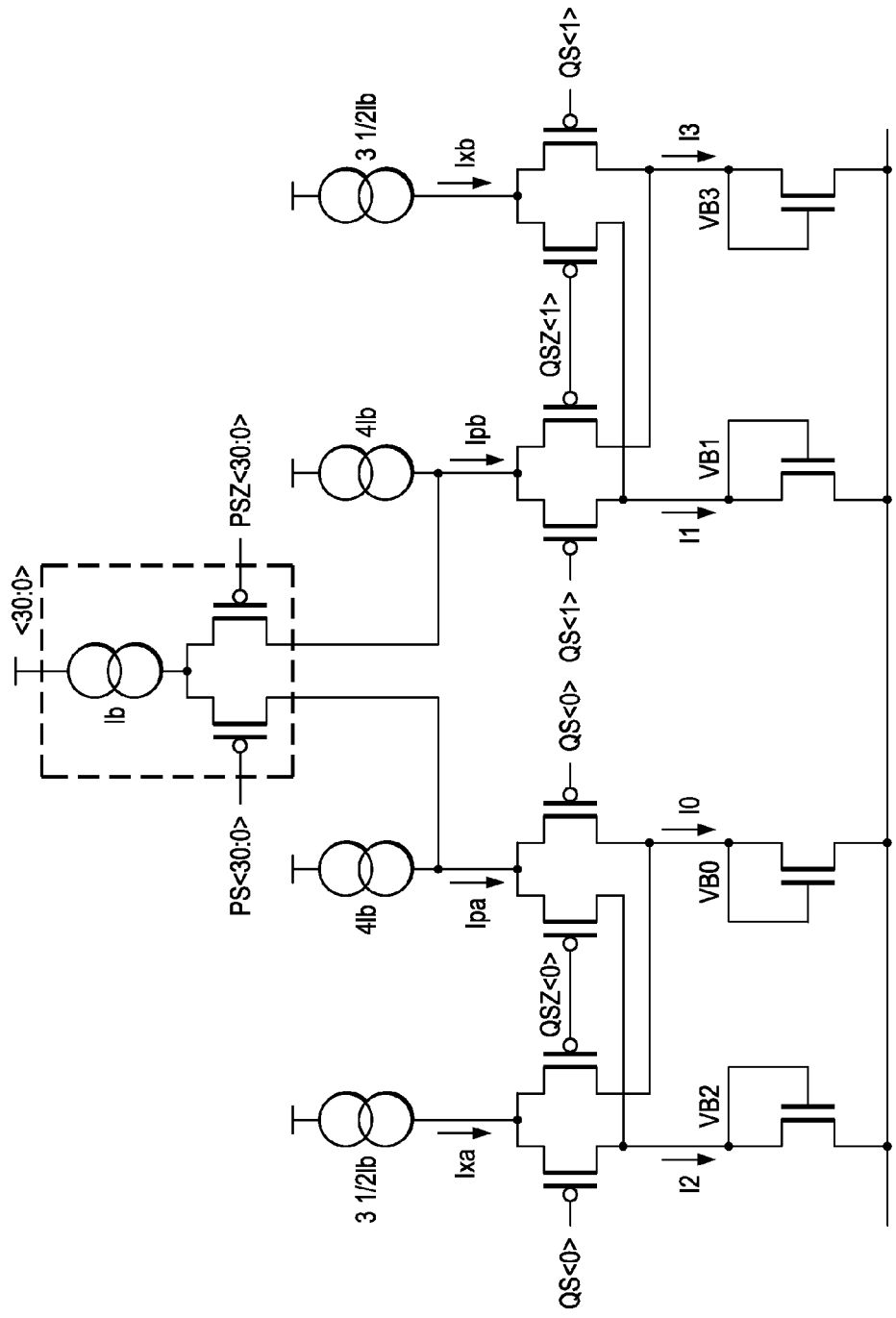
FIG. 2 shows the structure and operation of a bias generator.
Figure 2B:
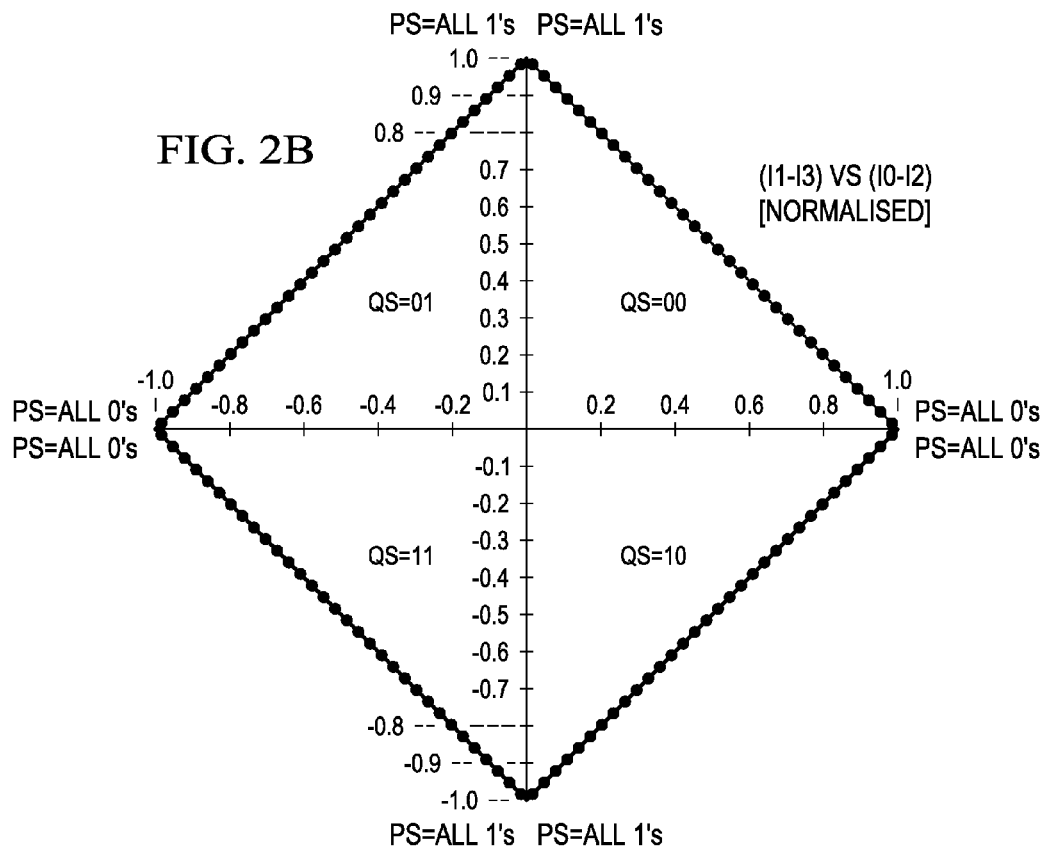

Using the phase coding scheme for the implementation shown in FIG. 2, to achieve a 90° rotation would involve a simultaneous change of quadrant select code (QS) and an inversion of all the phase select (PS) bits. Whilst this is not totally impractical, it does defeat one of the main advantages of the phase coding scheme, i.e. that it is purely Gray, with only one bit in the code changing between each phase step. Implementing the 90° phase step in the digital coding domain would conversely mean simultaneously changing the majority of signals, making the circuit vulnerable to glitching.

Figure 1:
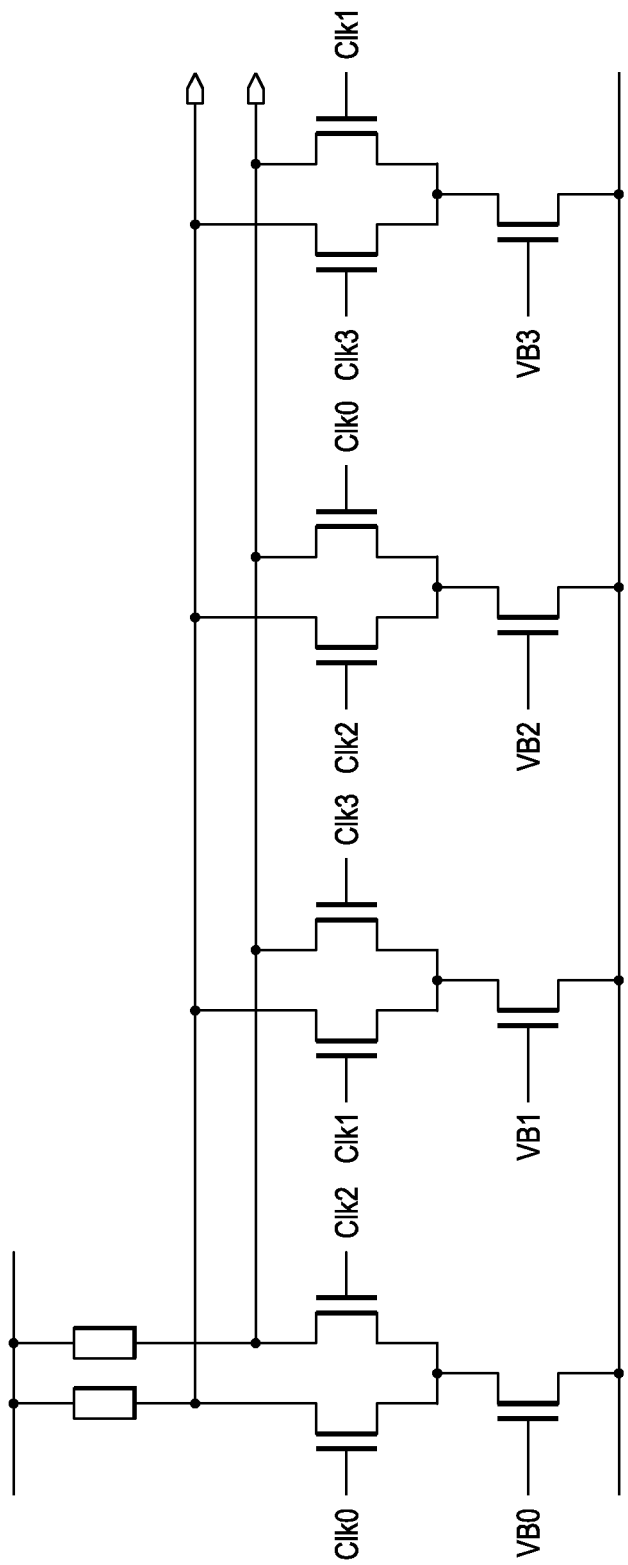
FIG. 1 shows a generic structure of a 4-quadrant phase interpolator.
Figure 3:
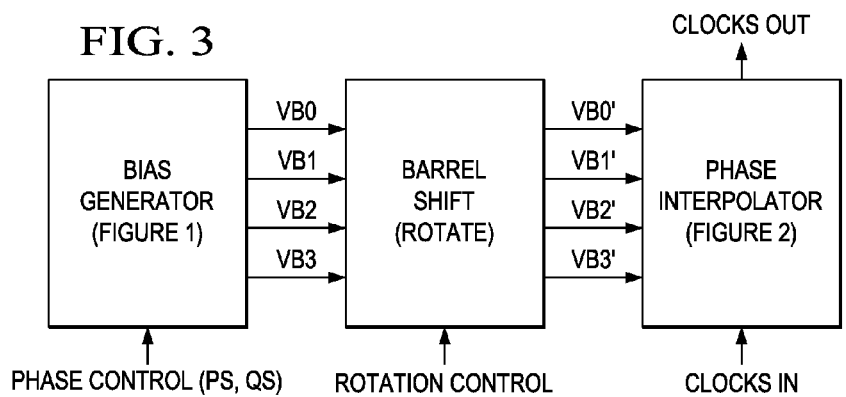
FIG. 3 shows an analogue barrel shifter arrangement.

Conceptually, an alternative approach would be to rotate the 4 analogue bias controls between the bias generator (FIG. 2) and the phase interpolation bridge (FIG. 1) using some form of analogue barrel shifter as shown in FIG. 3.

The concept of the barrel shifter is to rotate the bias signals between the bias generator and the interpolator bridge according to the required phase shift as shown in Table 1 below.

TABLE 1

| Rotate by 0° | Rotate by 90° | Rotate by 180° | Rotate by 270° |
| --- | --- | --- | --- |
| VB0→VB0' | VB0→VB1' | VB0→VB2' | VB0→VB3' |
| VB1→VB1' | VB1→VB2' | VB1→VB3' | VB1→VB0' |
| VB2→VB2' | VB2→VB3' | VB2→VB0' | VB2→VB1' |
| VB3→VB3' | VB3→VB0' | VB3→VB1' | VB3→VB2' |

Whilst it would be possible to implement this idea exactly as illustrated in FIG. 3, it is usually not good design practice to switch bias lines in this way as the resistance of the switch devices often renders the signals vulnerable to noise. This is particularly true of modern small-geometry CMOS processes with the relatively high threshold voltages of the MOS transistors relative to the power supply voltage.

An alternative would be to add the barrel shift function into the bias generator of FIG. 2. This circuit can be treated as a set of 4 current sources (Ipa, Ipb, Ixa and Ixb) which are switched through to a set of 4 diode-connected MOS transistor loads depending on the quadrant select code. The barrel shift function could be implemented by an extra layer of switches below the quadrant selection switches to direct each current to the required load element. The disadvantage of that solution is a degradation of voltage headroom for the circuit due to the extra level of switches.

Figure 4:
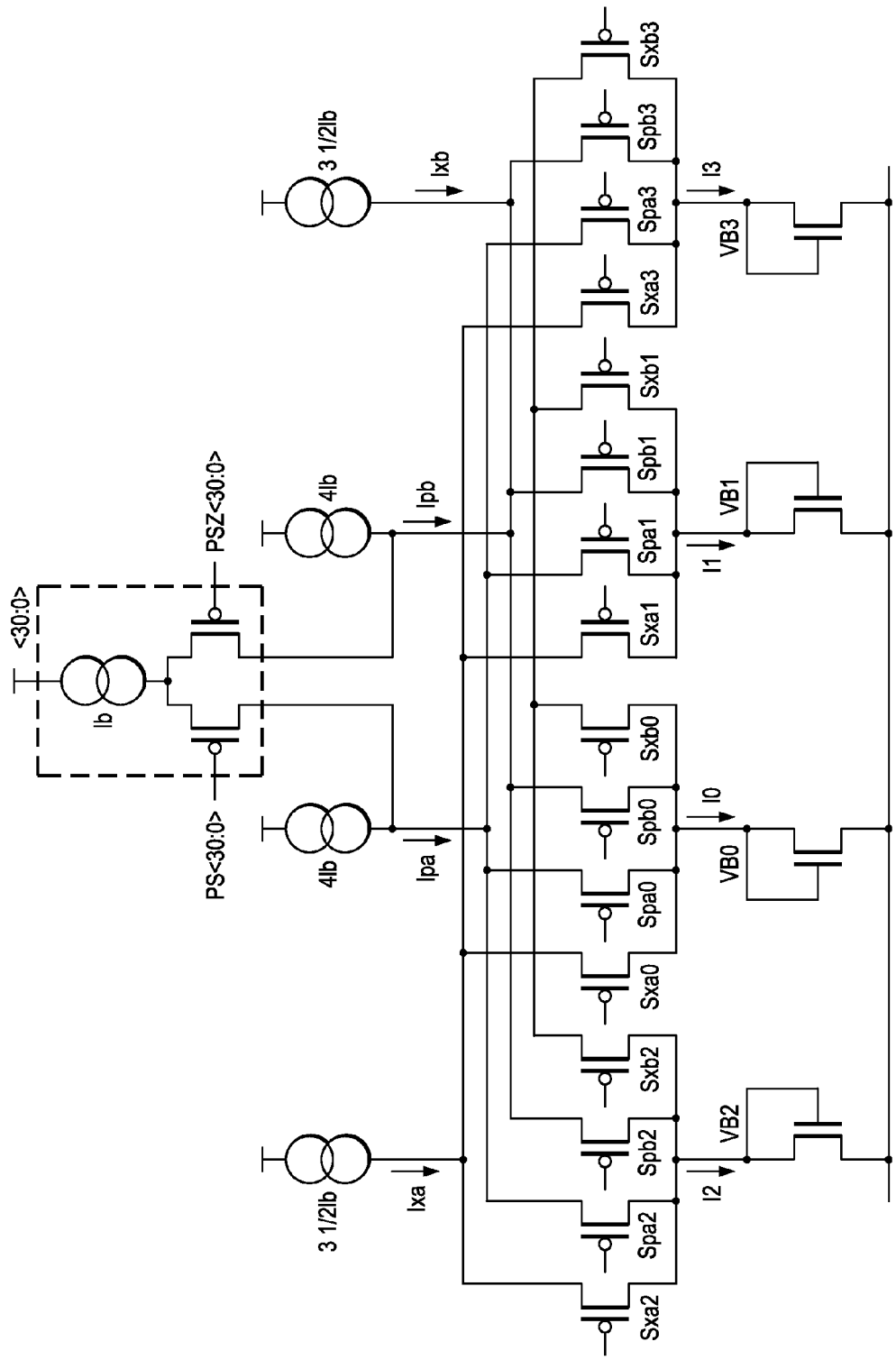
FIG. 4 shows a phase interpolator structure combining quadrant rotation function with quadrant selection function in a single level of switches.

The inventors realised that a better approach would be to combine the quadrant rotation function with the quadrant selection function in a single level of switches as shown in FIG. 4.

It can be seen in FIG. 4 that any of the four current sources (Ipa, Ipb, Ixa, Ixb) can be switched into any of the 4 loads by appropriate control of the single layer of switch devices. This is sufficient for adding the quadrant rotation (jump) facility to the usual phasecode quadrant selection control. The switch devices are configured as 4 groups of 4 switches: within each group only one of the 4 will be enabled at any time. The selection of the "on" devices will be a function of the quadrant select code (QS<1:0>) combined with an additional control to determine the quadrant rotation, QR<1:0> according to Table 2 below.

Rotate by 0° Rotate by 90° Rotate by 180° Rotate by 270°
QR<1:0>=00 QR<1:0>=01 QR<1:0>=11 QR<1:0>=10

TABLE 2

| Rotate by 0° | Rotate by 90° | Rotate by 180° | Rotate by 270° |
|---|---|---|---|
| QR<1:0> = 00 | QR<1:0> = 01 | QR<1:0> = 11 | QR<1:0> = 10 |

An inspection of FIG. 2 shows that the current switching function of the QS<1:0> control is described by the table below in which one of the phase steering currents (Ipa) and one of the bleed currents (Ixa) are swapped into I0 and I2 depending on the state of QS<0> whilst the other phase steering current (Ipb) and second bleed current (Ixb) are swapped into I1 and I2 depending on the state of QS<1>.

TABLE 3

Current switching matrix for the bias generator in FIG. 2

| QS<1> | QS<0> | I0 | I1 | I2 | I3 |
|---|---|---|---|---|---|
| 0 | 0 | Ipa | Ipb | Ixa | Ixb |
| 0 | 1 | Ixa | Ipb | Ipa | Ixb |
| 1 | 1 | Ixa | Ixb | Ipa | Ipb |
| 1 | 0 | Ipa | Ixb | Ixa | Ipb |

For the bias generator of FIG. 4 we need to extend this control with the addition of the new quadrant rotation control (QR<1:0>) as shown in the table below.

TABLE 4

Current switching matrix for the bias generator of FIG. 4.

| QR<1> | QR<0> | QS<1> | QS<0> | I0 | I1 | I2 | I3 | |
|---|---|---|---|---|---|---|---|---|
| 0 | 0 | 0 | 0 | Ipa | Ipb | Ixa | Ixb | 0° rotation |
| 0 | 0 | 0 | 1 | Ixa | Ipb | Ipa | Ixb | (default) |
| 0 | 0 | 1 | 1 | Ixa | Ixb | Ipa | Ipb | |
| 0 | 0 | 1 | 0 | Ipa | Ixb | Ixa | Ipb | |
| 0 | 1 | 0 | 0 | Ixb | Ipa | Ipb | Ixa | 90° shift |
| 0 | 1 | 0 | 1 | Ixb | Ixa | Ipb | Ipa | |
| 0 | 1 | 1 | 1 | Ipb | Ixa | Ixb | Ipa | |
| 0 | 1 | 1 | 0 | Ipb | Ipa | Ixb | Ixa | |
| 1 | 1 | 0 | 0 | Ixa | Ixb | Ipa | Ipb | 180° shift |
| 1 | 1 | 0 | 1 | Ipa | Ixb | Ixa | Ipb | |
| 1 | 1 | 1 | 1 | Ipa | Ipb | Ixa | Ixb | |
| 1 | 1 | 1 | 0 | Ixa | Ipb | Ipa | Ixb | |
| 1 | 0 | 0 | 0 | Ipb | Ixa | Ixb | Ipa | 270° shift |
| 1 | 0 | 0 | 1 | Ipb | Ipa | Ixb | Ixa | |
| 1 | 0 | 1 | 1 | Ixb | Ipa | Ipb | Ixa | |
| 1 | 0 | 1 | 0 | Ixb | Ixa | Ipb | Ipa | |

One can see from Table 4 how the value of QR<1:0> rotates the selection of currents applied to the mirror loads (i.e. the mapping of Ipa, Ipb, Ixa, Ixb onto I0, I1, I2, I3) according to the required shift of 0, 90, 180 or 270°.

One can also use this table to derive the combination of switches which need to be enabled for each combination of QR<1:0> and QS<1:0>. For example, if QR<1:0>=00 and QS<1:0>=00 (as in the top line of the table) then current Ipa gets switched through to I0 and thus requires switch Spa0 to be on; current Ipb gets switched through to I1 and thus requires switch Spb1 to be on; current Ixa gets switched through to I2 and thus requires switch Sxa2 to be on; current Ixb gets switched through to I3 and thus requires switch Sxb3 to be on. Applying this to each control combination gives the extended table shown below.

TABLE 5

Matrix of enabled switch devices according to QS/QR controls

| QR<1:0> | QS<1:0> | I0 | I1 | I2 | I3 | Spa0 | Spa1 | Spa2 | Spa3 | Spb0 | Spb1 | Spb2 | Spb3 |
|---|---|---|---|---|---|---|---|---|---|---|---|---|---|
| 00 | 00 | Ipa | Ipb | Ixa | Ixb | on | | | | | on | | |
| 00 | 01 | Ixa | Ipb | Ipa | Ixb | | | on | | | on | | |
| 00 | 11 | Ixa | Ixb | Ipa | Ipb | | | on | | | | | on |
| 00 | 10 | Ipa | Ixb | Ixa | Ipb | on | | | | | | | on |
| 01 | 00 | Ixb | Ipa | Ipb | Ixa | | on | | | | on | | |
| 01 | 01 | Ixb | Ixa | Ipb | Ipa | | | on | | | on | | |
| 01 | 11 | Ipb | Ixa | Ixb | Ipa | | | | | on | on | | |
| 01 | 10 | Ipb | Ipa | Ixb | Ixa | | on | | | | on | | |
| 11 | 00 | Ixa | Ixb | Ipa | Ipb | | | on | | | | | on |
| 11 | 01 | Ipa | Ixb | Ixa | Ipb | on | | | | | | | on |
| 11 | 11 | Ipa | Ipb | Ixa | Ixb | on | | | | | on | | |
| 11 | 10 | Ixa | Ipb | Ipa | Ixb | | | on | | | on | | |
| 10 | 00 | Ipb | Ixa | Ixb | Ipa | | | | | on | on | | |
| 10 | 01 | Ipb | Ipa | Ixb | Ixa | | on | | | | on | | |
| 10 | 11 | Ixb | Ipa | Ipb | Ixa | | on | | | | | | on |
| 10 | 10 | Ixb | Ixa | Ipb | Ipa | | | | | on | | | on |

| QR<1:0> | QS<1:0> | Sxa0 | Sxa1 | Sxa2 | Sxa3 | Sxb0 | Sxb1 | Sxb2 | Sxb3 | |
|---|---|---|---|---|---|---|---|---|---|---|
| 00 | 00 | | | on | | | | on | | 0° |
| 00 | 01 | on | | | | | | on | | |
| 00 | 11 | on | | | | | on | | | |
| 00 | 10 | | | on | | | on | | | |
| 01 | 00 | | | on | on | | | | on | 90° |
| 01 | 01 | | on | | | | on | | | |
| 01 | 11 | | on | | | | | on | | |
| 01 | 10 | | | on | | | on | | | |
| 11 | 00 | on | | | | | on | | | 180° |
| 11 | 01 | | | on | | | on | | | |
| 11 | 11 | | | on | | | | on | | |
| 11 | 10 | on | | | | | | on | | |
| 10 | 00 | | | on | | | on | | | 270° |
| 10 | 01 | | | | on | | on | | | |

TABLE 5-continued

Matrix of enabled switch devices according to QS/QR controls

| 10 | 11 |    | on | on |
| 10 | 10 | on |    | on |

By reorganising the information displayed in Table 5, as shown in Table 6 below, it is possible to determine the boolean logic required to switch each device on, as can be seen from Table 6 below as follows:

TABLE 6

Boolean Logic required to switch each device on.

| Spa0 : | ((QR<1:0> == 00) & (QS<0> == 0)) | ((QR<1:0> == 11) & (QS<0> == 1)) |
| Spa1 : | ((QR<1:0> == 01) & (QS<0> == 0)) | ((QR<1:0> == 10) & (QS<0> == 1)) |
| Spa2 : | ((QR<1:0> == 11) & (QS<0> == 0)) | ((QR<1:0> == 00) & (QS<0> == 1)) |
| Spa3 : | ((QR<1:0> == 10) & (QS<0> == 0)) | ((QR<1:0> == 10) & (QS<0> == 1)) |
| Spb0 : | ((QR<1:0> == 10) & (QS<1> == 0)) | ((QR<1:0> == 01) & (QS<1> == 1)) |
| Spb1 : | ((QR<1:0> == 00) & (QS<1> == 0)) | ((QR<1:0> == 11) & (QS<1> == 1)) |
| Spb2 : | ((QR<1:0> == 01) & (QS<1> == 0)) | ((QR<1:0> == 10) & (QS<1> == 1)) |
| Spb3 : | ((QR<1:0> == 11) & (QS<1> == 0)) | ((QR<1:0> == 00) & (QS<1> == 1)) |
| Sxa0 : | as Spa2 |
| Sxa1 : | as Spa3 |
| Sxa2 : | as Spa0 |
| Sxa3 : | as Spa1 |
| Sxb0 : | as Spb2 |
| Sxb1 : | as Spb3 |
| Sxb2 : | as Spb0 |
| Sxb3 : | as Spb1 |

The invention claimed is:

1. A phase interpolator with independent quadrant rotation, comprising:
  a switching circuit comprising a single level of switches;
  a set of 4 diode-connected MOS transistor loads;
  a set of four current sources operable to be switched by the switching circuit to any of the set of four transistor loads; and
  a control unit for providing switch operating signals to said switching circuit for enabling said level of switches;
  wherein the single level of switches is configured as four groups of four switches, and
  wherein said switching circuit is operable so that within each group only one of the four switches will be enabled at any one time.

* * * * *